(12) United States Patent
Tanaka et al.

(10) Patent No.: US 6,878,969 B2
(45) Date of Patent: Apr. 12, 2005

(54) LIGHT EMITTING DEVICE

(75) Inventors: Kenichiro Tanaka, Neyagawa (JP); Masao Kubo, Nara (JP); Tomoaki Matsushima, Souraku-gun (JP); Ryoichi Terauchi, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 75 days.

(21) Appl. No.: 10/447,232

(22) Filed: May 29, 2003

(65) Prior Publication Data

US 2004/0016936 A1 Jan. 29, 2004

(30) Foreign Application Priority Data

Jul. 29, 2002 (JP) ........................................ 2002-220323

(51) Int. Cl.[7] .............................................. H01L 29/72
(52) U.S. Cl. .............................. 257/79; 257/59; 257/82; 257/98; 257/434; 257/435; 257/680
(58) Field of Search .............................. 257/59, 79, 82, 257/98, 434, 435, 680

(56) References Cited

U.S. PATENT DOCUMENTS 5,463,229 A * 10/1995 Takase et al. ................. 257/59

FOREIGN PATENT DOCUMENTS

JP 6-291368 10/1994

* cited by examiner

Primary Examiner—Edward Wojciechowicz
(74) Attorney, Agent, or Firm—Oblon, Spivak, McClelland, Maier & Neustadt, P.C.

(57) ABSTRACT

A semiconductor light emitting device gives a large radiation surface with an enhanced light radiating capability. A N-type GaN layer and a P-type GaN layer are stacked to define therebetween an interface where a light is generated upon application of voltage across the interface. A light guide on which the GaN layers are developed is utilized to give a wide radiation surface from which the light is given off. The radiation surface is formed with a refractor layer composed of an array of a first medium and a second medium which have individual refraction indexes different from each other and are arranged alternately across the radiation surface. Thus, the light guide can be best utilized to give a large radiation surface, yet formed with the refractor layer which reduces multiple reflections inside of the light guide for effectively passing or radiating the light transmitted through the light guide.

25 Claims, 7 Drawing Sheets

LIGHT EMITTING DEVICE

TECHNICAL FIELD

The present invention is directed to a light emitting device, and more particularly to a semiconductor light emitting device with an enhanced light radiation capability.

BACKGROUND ART

Japanese Patent Publication No. 6-291368 discloses a semiconductor light emitting device designed to radiate a light effectively. The device includes a crystalline substrate made of sapphire on which two semiconductor layers of opposite conductive types are developed. A pair of electrodes is provided to apply a voltage across an interface between the two semiconductor layers for generating a light from around the interface. An exposed or outer one of the two semiconductor layers is finished to have an irregular surface with an array of minute concavities. With the formation of the irregular surface, it is intended to reduce multiple reflections within the outer semiconductor layer for giving off the light in a large extent through the irregular surface. However, due to a structural restriction that the outer semiconductor layer is covered by the electrode, the light radiation surface has to be correspondingly reduced and therefore the light radiation surface is restricted. In addition, the crystalline substrate essential for developing thereon the semiconductor layers is not utilized as giving a light radiation surface with the irregular surface, although the crystalline substrate could have a wider radiation surface than the outer semiconductor layer covered with the electrode.

DISCLOSURE OF THE INVENTION

In view of the above insufficiency, the present invention has been accomplished to provide an improved light emitting device which is capable of giving a large radiation surface with an enhanced light radiating capability. The light emitting device of the present invention includes a semiconductor light emitting unit composed of a first semiconductor layer of a first conductive type and a second semiconductor layer of a second conductive type opposite to the first conductive type. The second semiconductor layer is integrally stacked on the first semiconductor layer to define therebetween an interface. Electrodes are attached respectively to the first and second conductive layers to apply a voltage across the interface for emitting a light from around the interface. A light guide is superimposed on the first semiconductor layer and directing the light therethrough. The first semiconductor layer is developed on the light guide to form a unitary structure with the light guide and the second semiconductor layer. The light guide has a radiation surface through which the light is given off. The radiation surface is formed with a refractor layer composed of an array of a first medium and a second medium which have individual refraction indexes different from each other and are arranged alternately across the radiation surface. Thus, the light guide free from the electrodes can be best utilized to give a large radiation surface, yet formed with the refractor layer which reduces multiple reflections inside of the light guide for effectively passing or radiating the light transmitted through the light guide.

The light guide is made of a transparent crystalline substrate on which the first semiconductor layer is crystallized, while the second semiconductor layer is crystallized on the first semiconductor layer. The crystalline substrate is made of a material including sapphire, silicon carbide, gallium nitride, gallium arsenide, and gallium phosphide. Each of the first and second semiconductor layers is made of a material including gallium nitride, gallium arsenide, gallium phosphide, and aluminum nitride.

Preferably, the first and second mediums are spaced at a regular interval which is from ¼ to 4 times the wavelength of the light in order to lessen the change of the refraction index at the radiation surface for effectively radiating the light from within the light guide.

The refractory layer has an overall refraction index which is between that of a portion the light guide other than the refractor layer and that of an environmental medium outside of the refractor layer, also for lessening the change of the refraction index of the light passing through the radiation surface.

The first medium may be defined by the crystalline substrate, while the second medium may be a modified medium obtained by modifying the crystalline substrate with a laser beam irradiated on the substrate. With the use of the laser beam, it is made readily possible to process portions of the crystalline substrate into the modified medium for realizing the refractor layer in combination with the non-processed portions. The laser beam is selected to have a pulse width less than 1 (one) pico-second in order to cause no substantial heat damage to the first medium adjacent to the second medium, i.e., the laser-modified portions, thereby enabling to provide the refractor layer of a minute structure in which the first and second mediums are arranged alternately.

Alternately, the refractor layer may include an array of concavities to define the first medium as the medium of the transparent crystalline substrate between the adjacent concavities, and to define the second medium as an environmental medium entrapped in the concavities. Preferably, the concavities are formed through the steps of firstly irradiating a laser beam to the radiation surface to modify selected portions into modified mediums, and removing the modified medium to leave thereat the concavities. Also in this instance, the laser beam is best utilized to process the selected portions of the crystalline substrate successfully into the modified medium that are sufficiently minute and can removed easily removed from the substrate for leaving the concavities as intended. The laser beam is selected to have a pulse width less than 1 (one) pico-second so as not to cause substantial head damage to portions adjacent to the modified portions.

In order to effectively process the substrate, the portions of the modified medium are formed by an action of interference between a plurality of the laser beams irradiated simultaneously from different directions.

When the refractor layer is formed to have an array of the concavities, the concavities are designed to have a varying width which varies from portions to portion across the radiation surface to realize the Fresnel lens for directing the light effectively towards a particular direction.

The crystalline substrate may includes a photonic crystal structure for reflecting the light from the interface towards the radiation surface for effectively collecting the light. The photonic crystal structure may include an array of pillar elements extending in a depth direction of the crystalline substrate and being arranged in a regular pattern in which the pillar elements are spaced from each other by a distance corresponding to a wavelength or less of the light from the semiconductor light emitting unit. With this arrangement, the light emitted from the interface of the semiconductor light emitting unit, i.e., the interface between the first and second semiconductor layers can be effectively reflected toward the radiation surface for radiating the light at a minimum loss.

The semiconductor light emitting unit may include an internal reflector area having a photonic crystal structure for directing the light from the interface towards the light guide, also in order to give off the light effectively at a minimum loss. The photonic crystal structure may be formed to extend across the crystalline substrate and the semiconductor unit for reflecting the light towards the radiation surface at a maximum efficiency.

In order to reduce the multiple reflection inside of the light guide, and therefore to effectively radiate the light therefrom, the light guide may be designed to have a radiation surface which is a combination of a plurality of planar faces each forming an angle less than a critical angle with respect to a light axis of the light extending from a geometrical center of the interface.

Further, the radiation surface may be finished semi-spherical to shape the crystalline substrate into a plan-convex lens, said plan-convex lens having its optical center coincident with a center of the interface also for the same purpose of effectively radiating the light.

Instead of forming the light guide from a single crystalline substrate, the light guide may be a combination of the crystalline substrate and a transparent overcoat superimposed on the substrate. The overcoat is made of a material different from the substrate and has the radiation surface formed with the refractor layer. With this structure, the overcoat can be selected from the material which is easily processed to give the refractor layer, making it possible to fabricate the device at a reduced cost. For example, the overcoat is selected from the material including a quartz glass, epoxy resin, silicone resin, and gallium nitride.

The overcoat may be designed to have at its portion other than the refractor layer a refraction index either greater or smaller than that of the crystalline substrate.

Further, the second semiconductor layer may be covered with an additional light guide having an additional radiation surface through which the light is given off. The additional radiation surface is formed with an additional refractor layer comprising an array of a first medium and a second medium which have refraction indexes different from each other and are arranged alternately across the additional radiation surface.

These and still other objects and advantageous features of the present invention will become more apparent from the following detailed description of the preferred embodiments when taken in conjunction with the attached drawings.

DETAILED DESCRIPTION OF THE EMBODIMENTS

First Embodiment <FIGS. 1 to 7>

Figure 1:
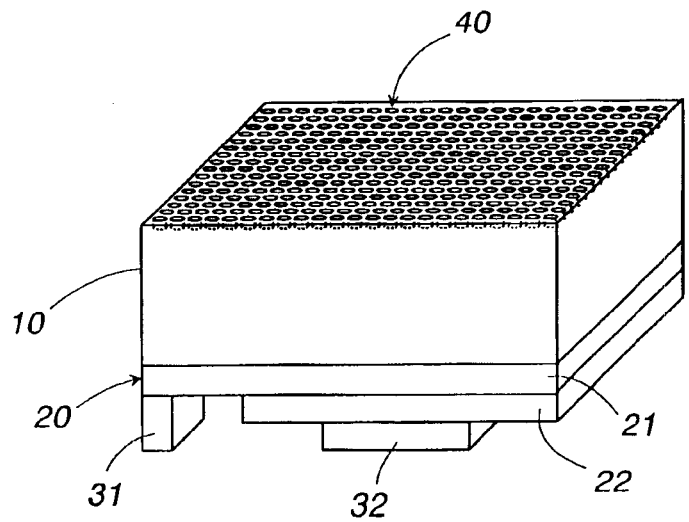
FIG. 1 a perspective view of a light emitting device in accordance with a first embodiment of the present invention.
Figure 2:
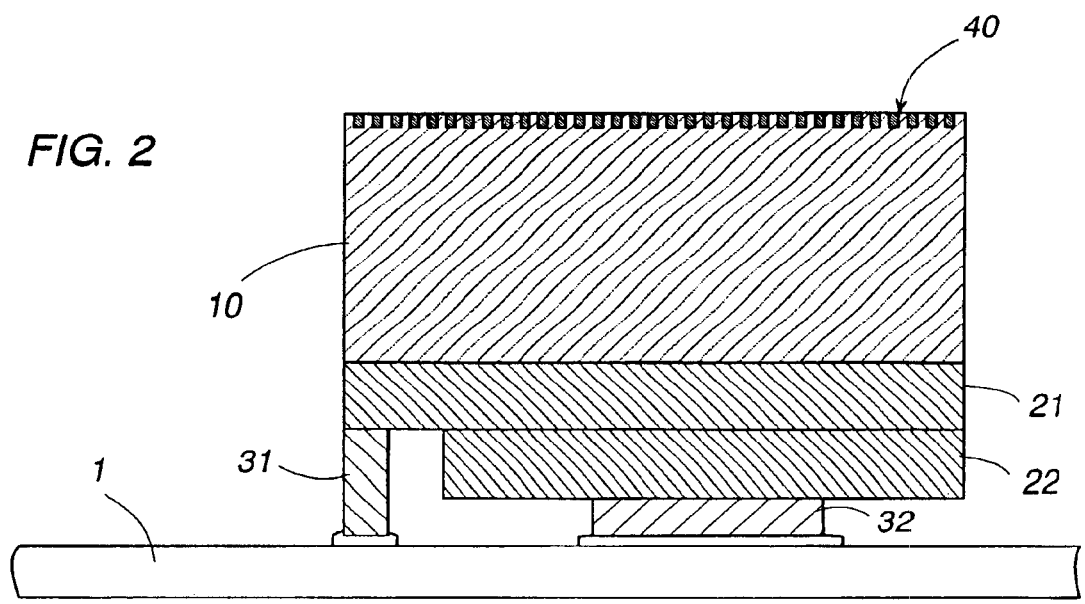
FIG. 2 is a sectional view of the device.

Referring now to FIG. 1, there is shown a light emitting device in accordance with a first embodiment of the present invention. The light emitting device is utilized as a discrete element mounted on a printed board, for example, to give a light of visible or ultraviolet ray upon receiving a control voltage. The device includes a transparent crystalline substrate 10 made of sapphire ($\alpha$-$Al_2O_3$) on which a semiconductor light emitting unit 20 is developed as a light source. The unit 20 is composed of a first semiconductor layer 21 made of n-type GaN (gallium nitride) and a second semiconductor layer 22 made of p-type GaN. The first semiconductor layer 21 is formed on the C-face of the crystalline substrate 10 by epitaxial growth, and the second semiconductor layer 22 is formed on the first semiconductor layer 21 by epitaxial growth to give an interface between the layers. It is the interface that generates the light when the control voltage is applied across the interface. Attached respectively to the first and second layers 21 and 22 are a first electrode 31 and a second electrode 32 which are surface mounted on the printed board 1, as shown in FIG. 2, for connection with a source of providing the control voltage. The light generated at the interface is directed through the layers 21 and 22, and also through the substrate 10 into an environmental medium, i.e., the air. In this sense, the substrate 10 defines a light guide for directing the light outwardly.

It is noted here that the above materials forming the crystalline substrate 10 as well as the semiconductor layers 21 and 22 are disclosed only for an exemplarily purpose. The crystalline substrate may be formed of another material including silicon carbide (SiC), gallium nitride (GaN), gallium arsenide (GaAs), and gallium phosphide (GaP). The semiconductor layers may be formed of another material including gallium nitride, gallium arsenide, gallium phosphide, and aluminum nitride (AlN).

Figure 3:
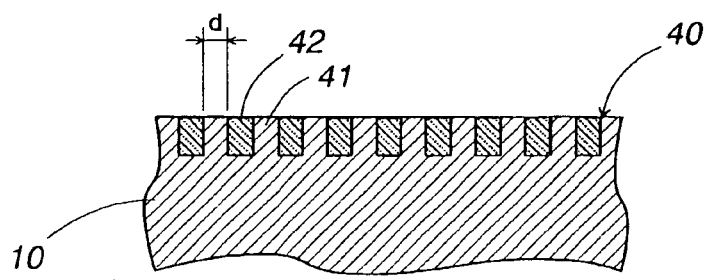
FIG. 3 is an enlarged partial sectional view of the device.

The crystalline substrate 10 is configured to have a top radiation surface of one square millimeter, for example, which is processed into a refractor layer 40 responsible for reducing multiple reflections of the light reaching the top radiation surface and therefore effectively radiating the light outwardly. As best shown in FIG. 3, the refractor layer 40 is realized by an array of a first medium 41 and a second medium 42 arranged alternately at a regular pattern or interval across the radiation surface to give an overall refraction index which is between those of the crystalline substrate 10 and the environmental medium, i.e., the air. The first medium 41 is defined by the material forming the substrate, while the second medium 42 is a modified medium obtained by modifying the material of the substrate by irradiation of a laser beam. The resulting modified medium has a refraction index smaller than the first medium and therefore gives the overall refraction index between those of the substrate and the air.

The laser beam is generated by a so-called femto laser having a wavelength of 800 nm and a pulse width of 150 fs (femto-seconds), and is irradiated to the top surface of the substrate 10 at a work energy of less than 1 μJ/pulse to give the discrete second mediums 42 each in the shape of a cylinder having approximately 100 nm diameter and approximately 100 nm depth or height. The first and second mediums 41 and 42 are spaced alternately by a distance (d) of ¼ to 4 times of the wavelength of the light. With the use of the laser having a pulse width of 150 fs, the first medium 41 or other portions adjacent to the second medium 42 is not affected by a thermal damage and is kept intact from the laser beam. In this connection, It is confirmed by the inventors that the substrate suffers from no substantial thermal damage when using the laser beam having a pulse width of 1 (one) pico-second. That is, the modification of the substrate into the second medium 42 can be done well before the heat generated by the laser radiation is transferred to the adjacent portions. With the use of the laser having such short pulse width, the crystalline substrate 10 can be processed to have the refractor layer 40 having the minutely distributed second mediums 42. Although the illustrated embodiment is shown to have the second mediums 42 which are distributed regularly across the radiation surface, the present invention should not be limited to this particular pattern and may encompass a structure in which the second mediums are distributed randomly over some portions in the radiation surface.

Figure 4:
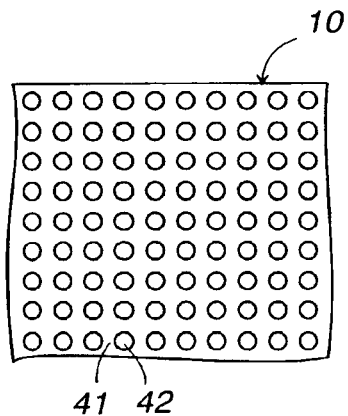
FIGS. 4 to 6 are top views illustrating patterns of radiation surfaces available in the device.
Figure 5:
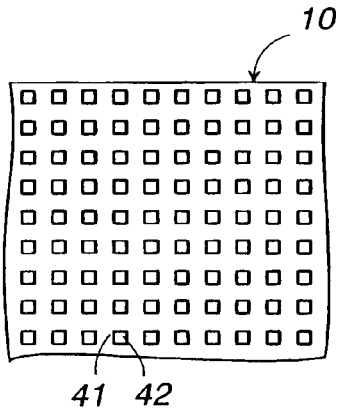
Figure 6:
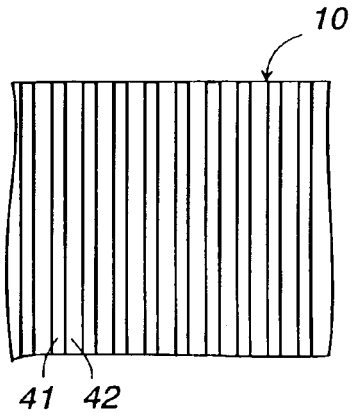

Although the above embodiment discloses the second mediums 42 as an array of the cylinders, as shown in FIGS. 2 to 4, they may be formed as an array of rectangular solids as shown in FIG. 5, or as an array of rectangular grooves extending along one dimension of the substrate, as shown in FIG. 6.

Figure 7:
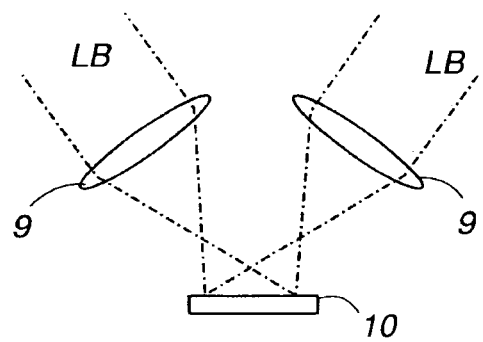
FIG. 7 is a schematic view illustrating a manner of forming the radiation surface by use of laser beams.

FIG. 7 shows a preferred scheme of modifying the surface of the substrate 10 into the array of the second mediums by using the interference between the two laser beams LB directed from different directions respectively through collection lenses 2. The laser beams are formed by splitting a single laser beam and are irradiated on the surface of the substrate simultaneously at a total work energy density of less than 100 MJ/m². Since the substrate can be processed to have the intended refractor layer in its radiation surface by being irradiated with the laser beam, the laser beam processing can be applied to the crystalline substrate 10 even after it is mounted on the printed board 1.

Figure 8A:
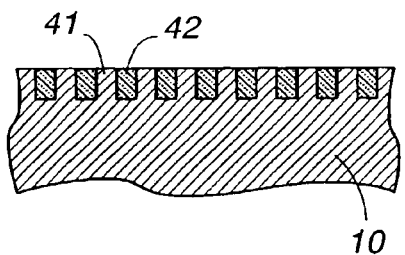
FIGS. 8A and 8B are partial sectional views illustrating the steps of forming the radiation surface in accordance with a second embodiment of the present invention.
Figure 8B:
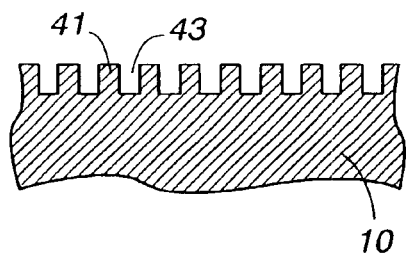
Figure 9:
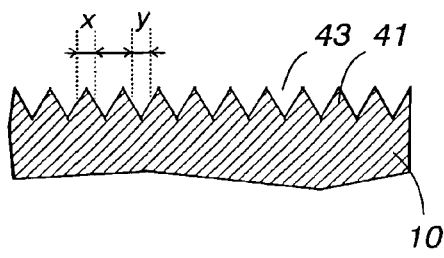
FIGS. 9 and 10 are partial sectional views illustrating modifications of the second embodiment.
Figure 10:
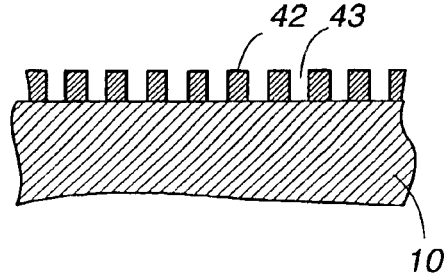

Second Embodiment <FIGS. 8 to 10>

FIGS. 8A and 8B show a light emitting device in accordance with a second embodiment of the present invention which is identical to the first embodiment except that the refractor layer 40 is realized by an array of concavities 43. In other words, the second medium is defined by the environmental medium, i.e., the air entrapped within the concavities, while the first medium 41 is defined by the unmodified substrate. Firstly, the top surface of the substrate 10 is processed by the laser beam radiation to give the array of the cylindrical modified mediums 42, as shown in FIG. 6A. Subsequently, the modified mediums 42 are removed with the use of a suitable etching solution to leave the concavities 43 thereat. For example, a water solution of 5% hydrofluoric acid is utilized as the etching solution. The resulting concavities 43 are arranged at a regular interval of ¼ to four times the wavelength of the light, giving to the refractor layer 40 an overall refraction index which is between those of the substrate other than the refractor layer and the environmental medium, i.e., the air. With this result, the multiple reflection of the light reaching the refractor layer 40 can be greatly reduced to give off the light outwardly from the radiation surface at a maximum efficiency.

The concavity 43 may be shaped to have a rectangular section, as shown in FIG. 8B, or a V-shaped section, as shown in FIG. 9. Most preferably, the concavity 43 is in the form of a cone with upside down. When such concavities are arranged at a regular interval of ¼ to one wavelength of the light, and the light has the wavelength of 200 nm to 500 nm, the overall or effective refraction index <nE> with regard to the TE (Transverse Electric) wave can be expressed by the following expression.

$$<nE> = \sqrt{\frac{x \cdot n_1^2 + y \cdot n_2^2}{x+y}}$$

where x is a width of the first medium 41, x is a width of the concavity 43, as indicated in FIG. 9, n1 is a refraction index of the first medium (substrate), and n2 is a refraction index of the air.

Also, the overall refraction index <nM> with regard to TM (Transvese Magnetic) wave can be expressed by the following expression.

$$<nM> = \sqrt{\frac{x+y}{x/n_1^2 + y/n_2^2}}$$

Further, the refractor layer 40 may be realized by an array of the modified mediums 42 which are distributed to leave concavities 43 between the adjacent modified mediums 42, as shown in FIG. 10. In this instance, the concavities 43 are firstly formed by removing selected portions of the radiation surface by the laser ablation, and subsequently the portions remained between the concavities are modified into the modified medium by the laser modification. The laser utilized is the femto laser having a wavelength of 800 nm and a pulse width of 150 fs (femto-seconds), and is irradiated to the top surface of the substrate 10 at a work energy of about 1 μJ/pulse to remove the selected portions by ablation, thereby forming the cylindrical concavities 43 of about 100 nm inside diameter, and is subsequently irradiated to the remaining portions at a work energy of 2 to 15 J/mm2 to form the modified mediums 42.

Figure 11:
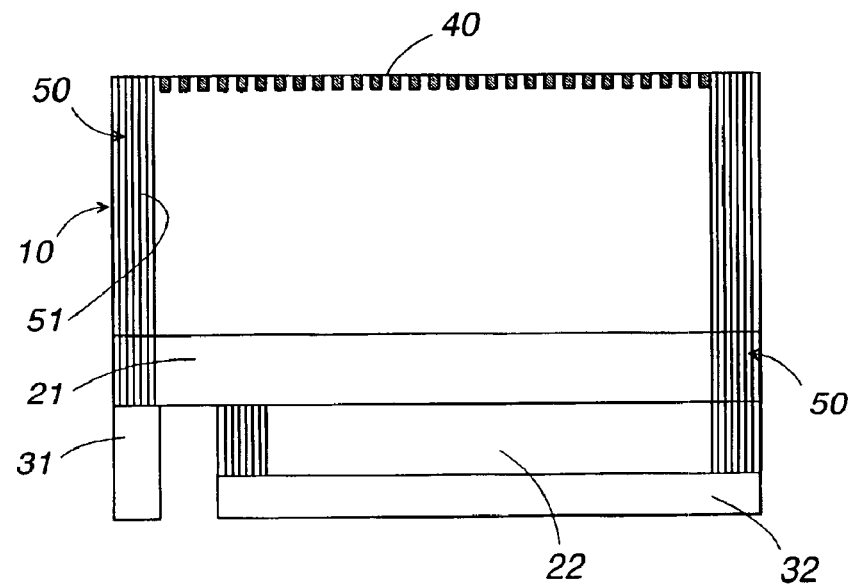
FIG. 11 is a sectional view of a device in accordance with a third embodiment of the present invention.
Figure 12:
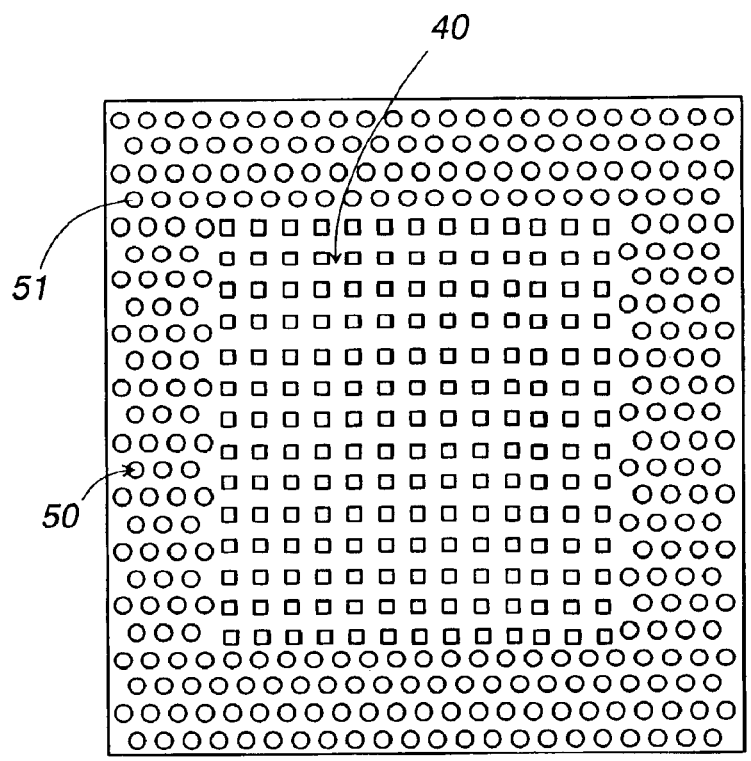
FIG. 12 is a top view of the above device.
Figure 13:
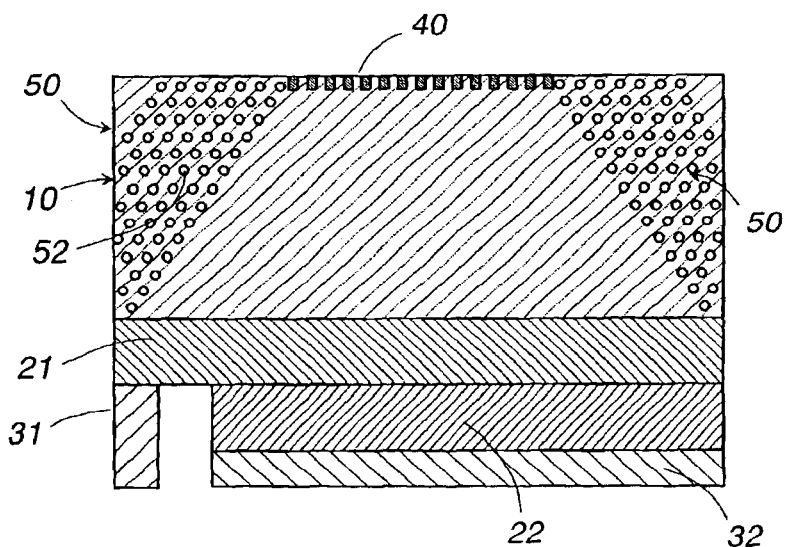
FIG. 13 is sectional view of a device in accordance with a fourth embodiment of the present invention.

Third Embodiment <FIGS. 11 & 12>

FIGS. 11 and 12 show a light emitting device in accordance with a third embodiment of the present invention which is identical to the first embodiment except that a photonic crystal structure 50 is formed inside of the crystalline substrate 10 as well as the semiconductor layers 21 and 22 for reflecting the light from the interface towards the top radiation surface of the substrate provided with the refractor layer 40. The photonic crystal structure 50 includes of a plurality of pillar crystal units 51 extending vertically in the circumferences of the substrate 10 and the semiconductor layers 21 and 22. The pillar crystal units are formed by the laser modification of the substrate, and are arranged at a regular interval of approximately half of the wavelength of the light, presenting a different crystalline structure which is cooperative with the adjacent unmodified substrate for reflecting the light. Thus, the light generated at the interface between the semiconductor layers 21 and 22 are collectively given off through the refractor layer 40 at the top center of the substrate 10. Like parts are designated by like reference numerals utilized in the first embodiment

Fourth Embodiment <FIGS. 13 to 17>

Figure 14:
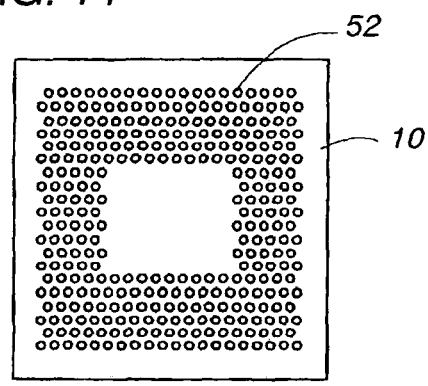
FIGS. 14 to 16 are horizontal sections at various heights of the device, respectively.
Figure 15:
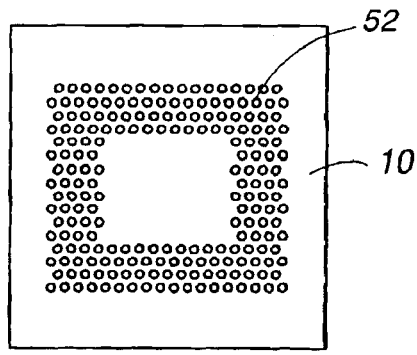
Figure 16:
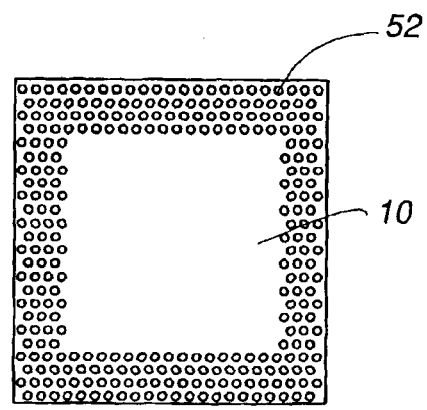

FIGS. 13 to 16 show a light emitting device in accordance with a fourth embodiment of the present invention which is identical to the first embodiment except that the crystalline substrate 10 is formed in its interior with a photonic crystal structure 50 for reflecting the light towards the radiation surface at the top center face of the substrate 10 where the refractor layer 40 is provided. The photonic crystal structure includes a plurality of spherical crystal units 52 which are arranged along three dimensions in such a pattern as to have different areas in various horizontal sections, as shown in FIGS. 14 to 16, for reflecting the light towards the refractor layer 40 of reduced area formed in the top center of the substrate 10. The spherical crystal units are formed by modifying the substrate with the laser, and are spaced at a regular interval of approximately half of the wavelength of the light. Like parts are designated by like reference numerals.

Figure 17:
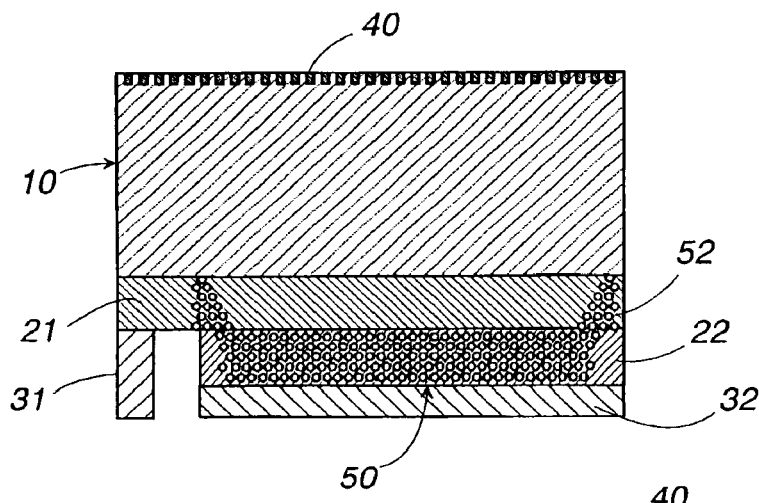
FIGS. 17 and 18 are sectional views of light emitting devices, respectively modifications of the above embodiment.
Figure 18:
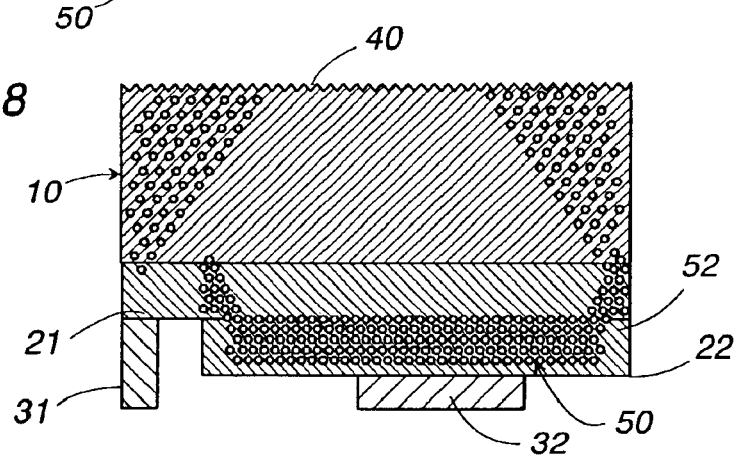

As shown in FIG. 17, the like photonic crystal structure may be formed in the semiconductor layers 21 and 22 to reflect the light towards the top surface of the substrate 10, while prohibiting the light from passing sideward out through the first semiconductor layer 21 as well as from passing downwardly out through the second semiconductor layer 22. Further, as shown in FIG. 18, the photonic crystal structure 50 composed of the spherical crystal units may be formed also in the periphery of the substrate 10 in order to radiate the light only through the refractor layer 40 at the top surface of the substrate.

Figure 19:
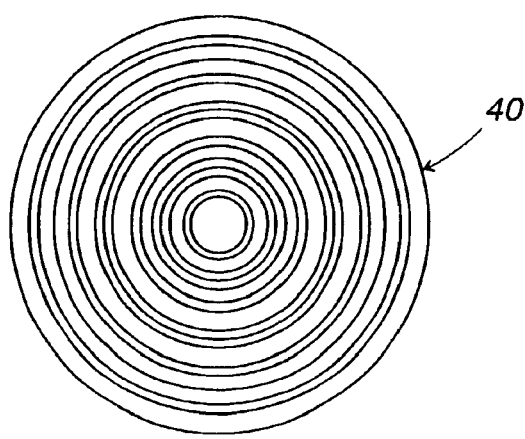
FIG. 19 is a top view of the light emitting device, a further modification of the above embodiment.
Figure 20:
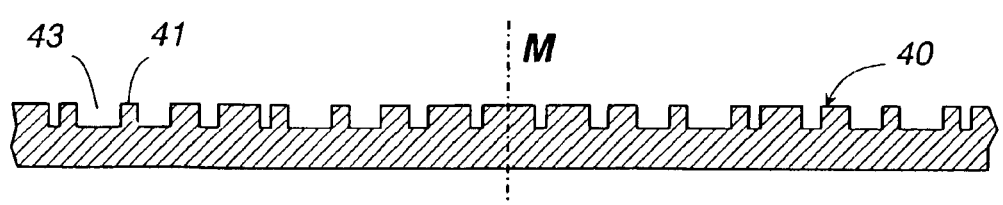
FIG. 20 is an enlarged section illustrating the radiation surface of the device of FIG. 19.

FIGS. 19 and 20 show a refractor layer 40 configured into the Fresnel lens which is applicable to any one of the embodiments disclosed herein. That is, the refractor layer 40 includes an array of concavities 43 arranged in a particular pattern to form the Fresnel lens. In detail, the refractor layer 40 has plural sets of the concavities 43 or concentric grooves about an optical axis M of the refractor layer 40. In each set, the width of the concavity alone is smaller towards the optical axis M, while the added width of the concavity and the adjacent first medium 41 is kept constant. The sets of the concavities 43 are repeated at a cycle greater than one wavelength of the light generated at the interface of the semiconductor layers, for giving off the light out through the refractor layer 40 towards optical axis M.

Figure 21:
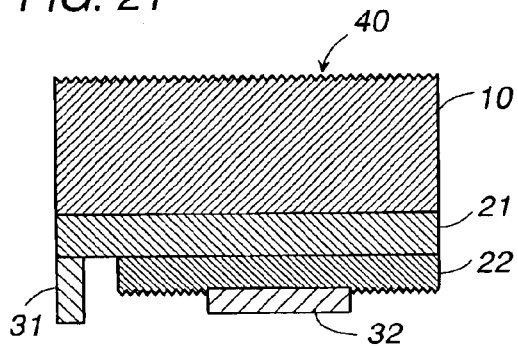
FIGS. 21 and 22 are sectional views respectively illustrating light emitting devices, further modifications of the above embodiment.

As shown in FIG. 21, the second semiconductor layer 22 may be additionally processed to give a refractor layer 24 of the same structure and function as the refractor layer of the crystalline substrate 10. The refractor layer 24 is formed in the lower exposed surface of the second semiconductor layer 22 around the electrode 32, for radiating the light effectively also out through the second semiconductor layer 22.

Figure 22:
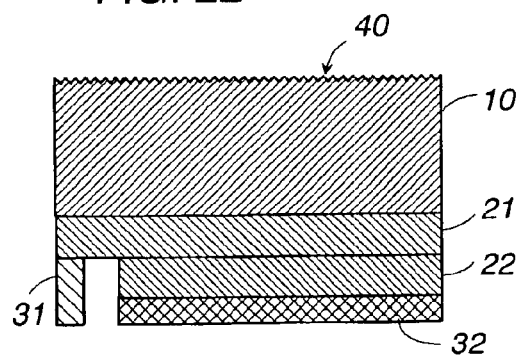

When the second semiconductor layer 22 is not required to give off the light, the electrode 32 is placed over the entire lower surface of the semiconductor layer 22 to reflect the back upwards, as shown in FIG. 22.

Figure 23:
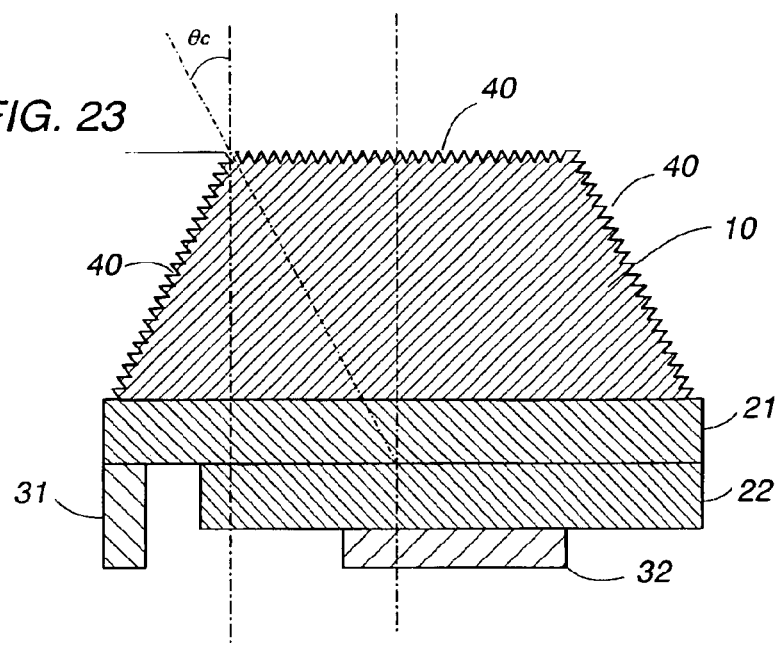
FIG. 23 is a sectional view of a light emitting device in accordance with a fifth embodiment of the present invention.
Figure 24:
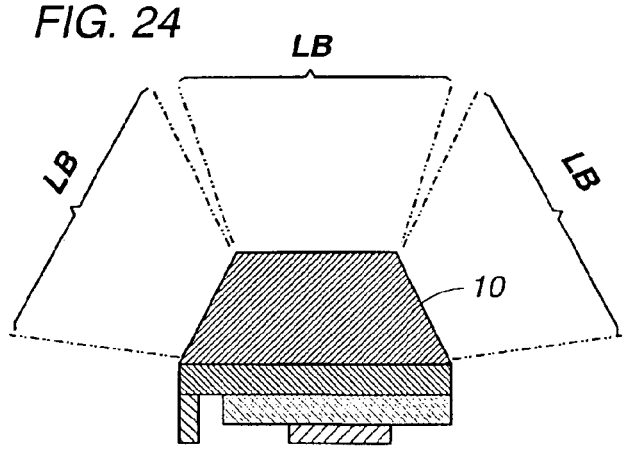
FIGS. 24 and 25 are schematic views respectively for illustrating the manner of forming the refractor layers.
Figure 25:
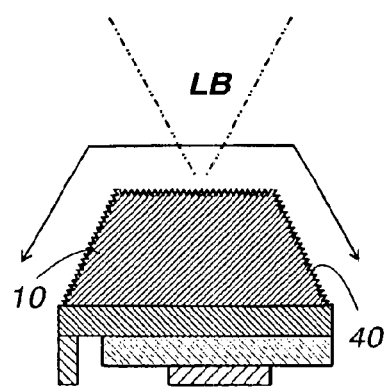

Fifth Embodiment <FIGS. 23 to 25>

FIG. 23 shows a light emitting device in accordance with a fifth embodiment of the present invention which is identical to the first embodiment except that the crystalline substrate 10 is shaped to have a plurality of the radiation surfaces each provided with the refractor layer 40. Like parts are designated by like reference numerals. Each radiation surface is a planar surface that forms an angle less than a critical angle ($\theta c$) with respect to the light advancing from the center of the interface. Thus, the substrate 10 can act to give off the light through all the exposed surfaces, while minimizing the multiple reflections within the substrate 10, thereby radiating the light at a maximum efficiency.

The substrate 10 is processed to give the intended surfaces by being ablated with the laser beams LB, as shown in FIG. 24, and is subsequently irradiated with the laser beam LB to give the refractor layer in each of the surfaces, as shown in FIG. 25. It is noted in this connection that the refractor layer 40 may be finished to have anyone of the structures as disclosed herein with reference to FIGS. 3 to 10.

Figure 26:
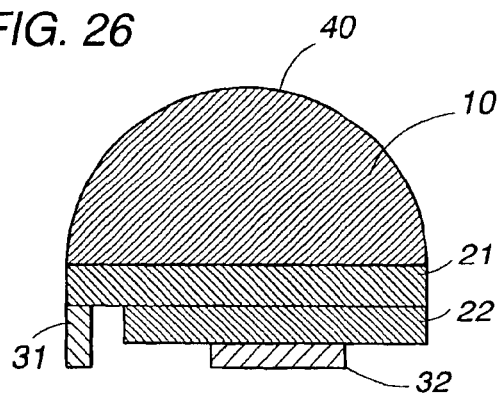
FIG. 26 is a sectional view of a light emitting device, a modification of the above embodiment.

Alternatively, the substrate 10 may be shaped into a plan-convex lens having a semispherical radiation surface provided with the refractor layer 40, as shown in FIG. 26. All points of the semi-spherical radiation surface give an angle less than the critical angle with respect to the light proceeding from the center of the interface between the first and second semiconductor layers 21 and 22. The semi-spherical radiation surface is formed by the laser ablation and is subsequently processed by the laser beam to provide the refractor layer 40.

Figure 27:
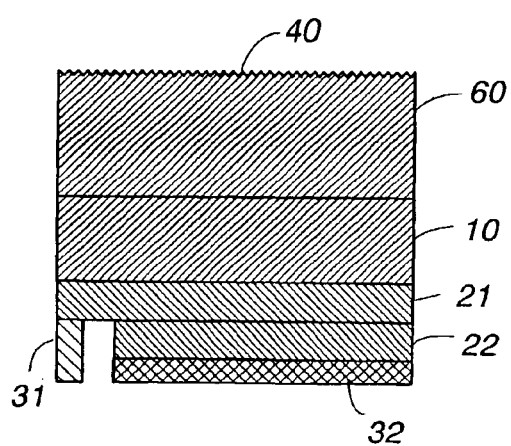
FIG. 27 is a sectional view of a light emitting device in accordance with a sixth embodiment of the present invention.
Figure 28:
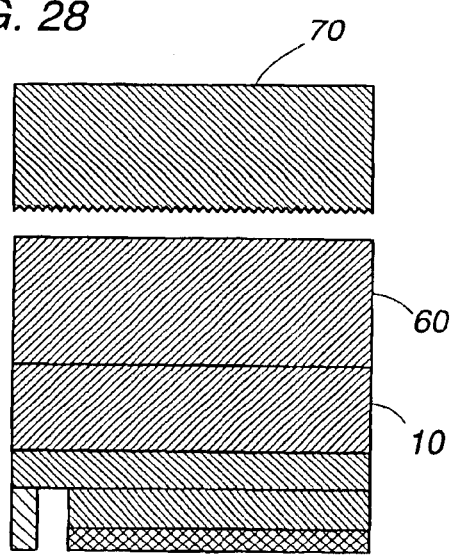
FIG. 28 is a sectional view illustrating a manner of forming the refractor layer of FIG. 27.

Sixth Embodiment <FIGS. 27 and 28>

FIG. 27 shows a light emitting device in accordance with a sixth embodiment of the present invention which is identical to the first embodiment except that the crystalline substrate 10 is covered with an overcoat 60 made of a material different from the substrate but also transparent to the light emitted from the semiconductor layers. The overcoat 60 is therefore cooperative with the substrate to define the light guide and has a radiation surface through which the light is given off. The overcoat 60 is made of the material including quartz glass, epoxy resin, silicon resin, and gallium nitride that is easily processed to give the refractor layer 40 without necessarily resorting to the laser ablation or modification technique as explained hereinbefore. For instance, it is possible to rely on a die impression technique for transcription of an array of concavities into a top surface of the overcoat 60 from a die 70, as shown in FIG. 28. The top face of the overcoat can be heated by being irradiated with the laser beam in order to facilitate the transcription or the formation of the refractor layer 40 in the top face of the overcoat 60.

Figure 29:
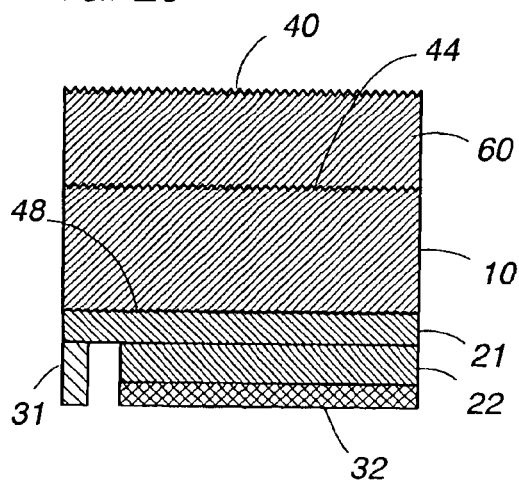
FIGS. 29 and 30 are sectional views illustrating modifications of the above embodiment.

Preferably, the overcoat 60 is selected from the material having the refraction index greater than the substrate 10. When, on the other hand, the overcoat 60 is made of the material having a refraction index lower than that of the crystalline substrate 10, it is preferred to provide an additional refractor layer 44 at the interface between the overcoat 60 and the substrate 10, as shown in FIG. 29. The additional refractor layer 44 is defined by an array of the first medium and the second medium alternating with each other at a regular interval of ¼ to 4 times the wavelength of the light. For example, the first medium is the material of the overcoat 60, while the second medium is the material of the substrate 10. This can be made by forming an array of concavities in the bottom of the overcoat 60 and by pressing the resulting serrated bottom into the top surface of the substrate 10. Instead, the additional refractor layer 44 may have the structure as disclosed with reference to FIGS. 2 and 3, and is formed on either of the substrate or the overcoat. It is still possible to provide a further refractor layer 48 at the interface between the substrate 10 and the first semiconductor layer 21, as illustrated for effectively directing the light towards the top radiation surface of the overcoat 60.

Figure 30:
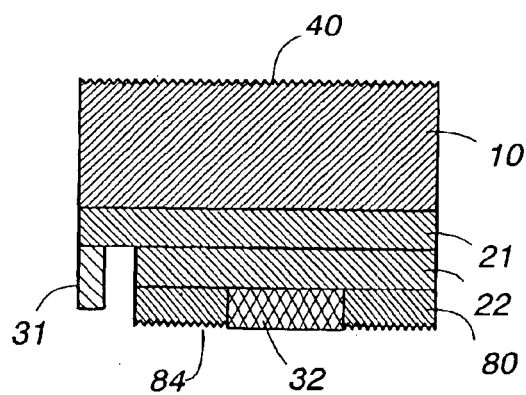

FIG. 30 shows a modification in which an additional light guide 80 is superimposed on the lower surface of the second semiconductor layer 22 in order to draw the light effectively also through the semiconductor layer 22 with the addition of the refractor layer 84. The light guide 80 is equivalent to the overcoat 60 of FIG. 29, and is selected from the material which is different from the semiconductor layer and includes including quartz glass, epoxy resin, and silicon resin. The light guide 80 is formed on the entire lower surface of the second semiconductor layer 22 other than the second electrode 32, and is processed to have the refractor layer 84 of the structure as explained in the above.

It should be noted that the individual features disclosed with reference to the specific embodiments and modifications may be suitably combined without departing from the concept of the present invention. Therefore, the present invention encompasses any adequate combination of the individual features.

What is claimed is:

1. A light emitting device comprising:
   a semiconductor light emitting unit producing a light, said light emitting unit being composed of a first semiconductor layer of a first conductive type and a second semiconductor layer of a second conductive type opposite to said first conductive type, said second semiconductor layer being integrally stacked on said first semiconductor layer to define therebetween an interface;
   a pair of electrodes being attached respectively to said first and second semiconductor layers to apply a voltage across said interface for emitting the light from around said interface,
   a light guide superimposed on said first semiconductor layer and directing the light therethrough, said first semiconductor layer being developed directly on said light guide to form a unitary structure with said light guide and said second semiconductor layer;
   said light guide having a radiation surface through which said light is given off,
   wherein
   said radiation surface is formed with a refractor layer which comprises an array of a first medium and a second medium, said first and second mediums having refraction indexes different from each other and being arranged alternately across said radiation surface.

2. The light emitting device as set forth in claim 1, wherein
   said light guide is made of a transparent crystalline substrate on which said first semiconductor layer is crystallized, and said second semiconductor layer being crystallized on said first semiconductor layer.

3. The light emitting device as set forth in claim 2, wherein
   said transparent crystalline substrate is made of a material selected from a group consisting of sapphire, silicon carbide, gallium nitride, gallium arsenide, and gallium phosphide, and
   each of said first and second semiconductor layers being made of a material selected from a group consisting of gallium nitride, gallium arsenide, gallium phosphide, and aluminum nitride.

4. The light emitting device as set forth in claim 2, wherein
   each of said first and second mediums is spaced at a regular interval which is from ¼ to 4 times the wavelength of said light.

5. The light emitting device as set forth in claim 2, wherein
   said refractor layer has an overall refraction index which is between that of a portion of said light guide other than said refractor layer and that of an environmental medium outside of said refractor layer.

6. The light emitting device as set forth in claim 2, wherein
   said first medium is the medium of said transparent crystalline substrate, and
   said second medium is a modified medium obtained by modifying said crystalline substrate with a laser beam irradiated on said crystalline substrate.

7. The light emitting device as set forth in claim 6, wherein
   said laser beam has a pulse width less than 1 (one) pico-second.

8. The light emitting device as set forth in claim 2, wherein
   said refractor layer includes an array of concavities to define said first medium as the medium of said transparent crystalline substrate between the adjacent concavities and define said second medium as an environmental medium entrapped in said concavities.

9. The light emitting device as set forth in claim 8, wherein
   said concavities are formed through the steps of:
   irradiating a laser beam to said radiation surface to modify the selected portions thereof into modified mediums; and
   removing said modified medium to leave thereat said concavities.

10. The light emitting device as set forth in claim 9, wherein
    said laser beam has a pulse width less than 1 (one) pico-second that causes no heat damage to a portion adjacent to the resulting refractory layer.

11. The light emitting device as set forth in claim 9, wherein
    said modified medium is formed by an action of interference between a plurality of laser beams irradiated simultaneously from different directions.

12. The light emitting device as set forth in claim 2, wherein
    said refractor layer has an array of concavities formed in said radiation surface to define said first medium by portions between the adjacent concavities and define said second medium as an environmental medium entrapped within said concavities, said concavities having a varying width which varies from portions to portion across said radiation surface to realize the Fresnel lens.

13. The light emitting device as set forth in claim 2, wherein
said transparent crystalline substrate includes a photonic crystal structure for reflecting the light from said interface towards said radiation surface.

14. The light emitting device as set forth in claim 13, wherein
said photonic crystal structure comprises an array of pillar elements extending in a depth direction of said transparent crystalline substrate and being arranged n a regular pattern in which said pillar elements are spaced from each other by a distance corresponding to a wavelength or less of the light from said semiconductor light emitting unit.

15. The light emitting device as set forth in claim 1, wherein
said semiconductor light emitting unit includes an internal reflector area having a photonic crystal structure for directing the light from said interface towards said light guide.

16. The light emitting device a set forth in claim 2, wherein
a photonic crystal structure is formed to extend across said transparent crystalline substrate and said semiconductor unit for reflecting the light from said interface towards said radiation surface.

17. The light emitting device as set forth in claim 2, wherein
said radiation surface comprises a plurality of planar faces each forming an angle less than a critical angle with respect to a light axis of said light proceeding from a center at said interface.

18. The light emitting device as set forth in claim 2, wherein
said radiation surface is semi-spherical to shape said transparent crystalline substrate into a plan-convex lens, said plan-convex lens having its optical center coincident with a center of said interface.

19. The light emitting device as set forth in claim 1, wherein
said light guide is composed of a transparent crystalline substrate on which said first semiconductor layer is developed, and a transparent overcoat superimposed on said transparent crystalline substrate, said overcoat being made of a material different from said transparent crystalline substrate and having said radiation surface with said refractor layer.

20. The light emitting device as set forth in claim 19, wherein
said transparent crystalline substrate is made of a material selected from a group consisting of sapphire, silicon carbide, gallium nitride, gallium arsenide, and gallium phosphide, and
said overcoat being made of a material selected from a group consisting of a quartz glass, epoxy resin, silicon resin, and gallium nitride.

21. The light emitting device as set forth in claim 19, wherein
said overcoat has at its portion other than said top refractor layer a refraction index greater than that of said transparent crystalline substrate.

22. The light emitting device as set forth in claim 19, wherein
said overcoat has at its portion other than said refractory layer a refraction index smaller than that of said transparent crystalline substrate.

23. The light emitting device as set forth in claim 19, wherein
an additional refractor layer is formed at an interface between said overcoat and said crystalline substrate, said additional refractor layer comprising an array of a first medium and a second medium which have different refraction indexes and which are arrange alternately across said interface between the overcoat and the crystalline substrate.

24. The light emitting device as set forth in claim 2, wherein
an additional light guide is superimposed on said second semiconductor layer, said additional light having an additional radiation surface through which said light is given off, said additional radiation surface being formed with an additional refractor layer comprising an array of a first medium and a second medium, said first and second mediums having refraction indexes different from each other and being arranged alternately across said additional radiation surface.

25. The light emitting device as set forth in claim 1, wherein
an additional refractor layer is formed at an interface between the light guide and said first semiconductor layer, said additional refractor layer having an overall refraction index which is between those of the first semiconductor layer and said light guide.

* * * * *